United States Patent
Kim et al.

(10) Patent No.: US 7,881,115 B2
(45) Date of Patent: Feb. 1, 2011

(54) METHOD OF PROGRAMMING NONVOLATILE MEMORY DEVICE

(75) Inventors: Ji Hwan Kim, Seoul (KR); Seong Je Park, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 61 days.

(21) Appl. No.: 12/471,546

(22) Filed: May 26, 2009

(65) Prior Publication Data

US 2010/0182839 A1 Jul. 22, 2010

(30) Foreign Application Priority Data

Jan. 21, 2009 (KR) .................. 10-2009-0005071

(51) Int. Cl.
*G11C 16/04* (2006.01)
(52) U.S. Cl. .............................. 365/185.18; 365/185.22; 365/185.12
(58) Field of Classification Search ............ 365/185.18, 365/185.22, 185.12
See application file for complete search history.

(56) References Cited

U.S. PATENT DOCUMENTS 7,773,427 B2 * 8/2010 Park et al. .............. 365/185.22

FOREIGN PATENT DOCUMENTS

KR 1020080089335 10/2008

* cited by examiner

*Primary Examiner*—Huan Hoang
(74) *Attorney, Agent, or Firm*—IP & T Group LLP

(57) ABSTRACT

According to a method of programming a nonvolatile memory device, a program operation is performed on a first page by applying a program pulse to the first page. A verification operation is performed on the program operation by applying a verification voltage to the first page. If the program operation for the first page has not been completed, a voltage selected from threshold voltages of the first page is set as a highest threshold voltage. The program operation for the first page is completed by repeatedly performing a program operation and a verification operation on the first page while a voltage level of the program pulse is increased. The sum of a program start voltage for the first page and a difference between the verification voltage and the highest threshold voltage is set as a program start voltage for a second page.

8 Claims, 5 Drawing Sheets

FIG. 5
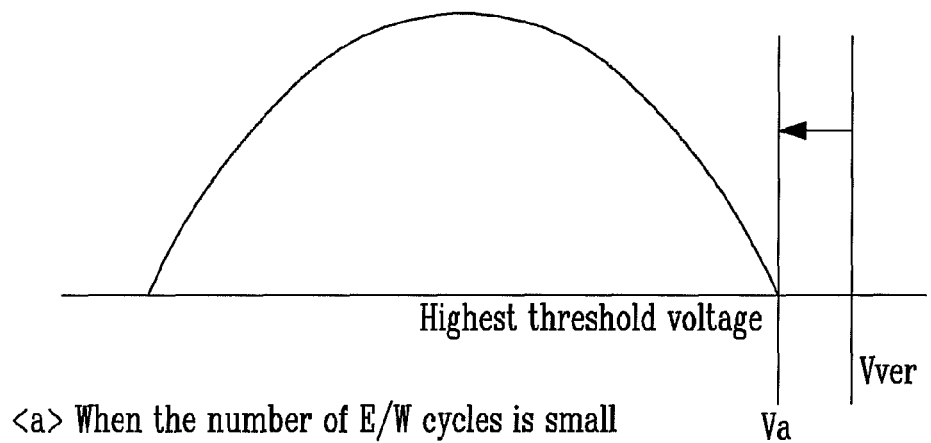
<a> When the number of E/W cycles is small
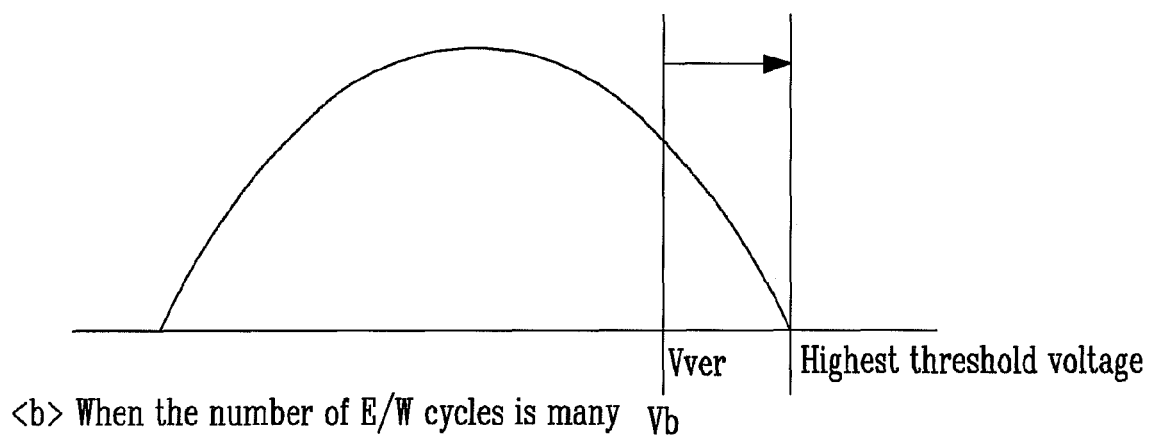
<b> When the number of E/W cycles is many

METHOD OF PROGRAMMING
NONVOLATILE MEMORY DEVICE

CROSS-REFERENCES TO RELATED APPLICATIONS

Priority to Korean patent application number 10-2009-0005071 filed on Jan. 21, 2009, the entire disclosure of which is incorporated by reference herein, is claimed.

BACKGROUND

One or more embodiments relate to a method of programming a nonvolatile memory device.

Recently, there is an increasing demand for nonvolatile memory devices which can be electrically programmed and erased and do not require the refresh function of rewriting data at specific periods.

A nonvolatile memory cell enables electrical program/erase operations and performs the program and erase operations through a threshold voltage variation when electrons are migrated by a relatively strong electric field applied to a thin oxide layer.

The nonvolatile memory device typically includes a memory cell array in which cells for storing data are arranged in a matrix form and a page buffer for writing data into specific cells of the memory cell array or reading data stored in specific cells thereof. The page buffer includes bit line pairs connected to specific memory cells, a register for temporarily storing data to be written into the memory cell array or reading the data of specific cells from the memory cell array and temporarily storing the read data, a sensing node for detecting the voltage level of a specific bit line or a specific register, and a bit line select unit for controlling whether to connect the specific bit line to the sensing node.

It has been known that the program speed of a nonvolatile memory device increases as the number of program/erase cycles increases. This is because, with the increasing number of program/erase cycles, electric charges trapped at the floating gate of each of the memory cells increase, so the threshold voltage of each cell increases. Accordingly, although a relatively small program pulse is applied to the cell using an Incremental Step Pulse Program (ISPP) method, the cell may be programmed to have a target threshold voltage or a larger voltage.

A method of setting and applying a low program start voltage in the ISPP method may be taken into consideration. If this method is used when the number of program/erase cycles is relatively small, the time for performing an operation increases. This is because, with a lower program start voltage, the number of pulses to be applied increases.

SUMMARY OF THE INVENTION

One or more embodiments are directed towards a method of programming a nonvolatile memory device, which is capable of variably setting a program start voltage depending on the increase in the number of program/erase cycles.

One or more embodiments are directed to a method of programming a nonvolatile memory device, including performing a program operation on a first page by applying a program pulse to the first page, performing a verification operation on the program operation by applying a verification voltage to the first page, if, as a result of the verification operation, the program operation for the first page has not been completed, setting a voltage, selected from threshold voltages of the first page, as a highest threshold voltage, completing the program operation for the first page by repeatedly performing a program operation and a verification operation on the first page while the program pulse is increased, setting a sum of a program start voltage for the first page and a difference between the verification voltage and the highest threshold voltage as a program start voltage for a second page, and performing a program operation for the second page based on the set program start voltage for the second page.

One or more embodiments are directed to a method of programming a nonvolatile memory device by applying dummy program pulses in order to compensate for an increased program speed caused by an increased number of program/erase cycles, including performing a program operation on a first page by applying a program pulse to the first page, performing a verification operation on the program operation by applying a verification voltage to the first page, if, as a result of the verification operation, the program operation for the first page has not been completed, setting a voltage, selected from threshold voltages of the first page, as a highest threshold voltage, completing the program operation for the first page by repeatedly performing a program operation and a verification operation on the first page while the program pulse is increased, setting a sum of a program start voltage for the first page and a difference between the verification voltage and the highest threshold voltage as a program start voltage for a second page, and performing a program operation for the second page based on the set program start voltage for the second page.

BRIEF DESCRIPTION OF THE DRAWINGS

FIG. 5 is a diagram showing the concept of an exemplary method of setting the highest threshold voltage in the method of programming a nonvolatile memory device according to an embodiment.

DESCRIPTION OF SPECIFIC EMBODIMENT

Hereinafter, the present disclosure will be described in detail in connection with one or more embodiments with reference to the accompanying drawings. The figures are provided to allow those having ordinary skill in the art to understand the scope of one or more embodiments of the disclosure.

Figure 1:
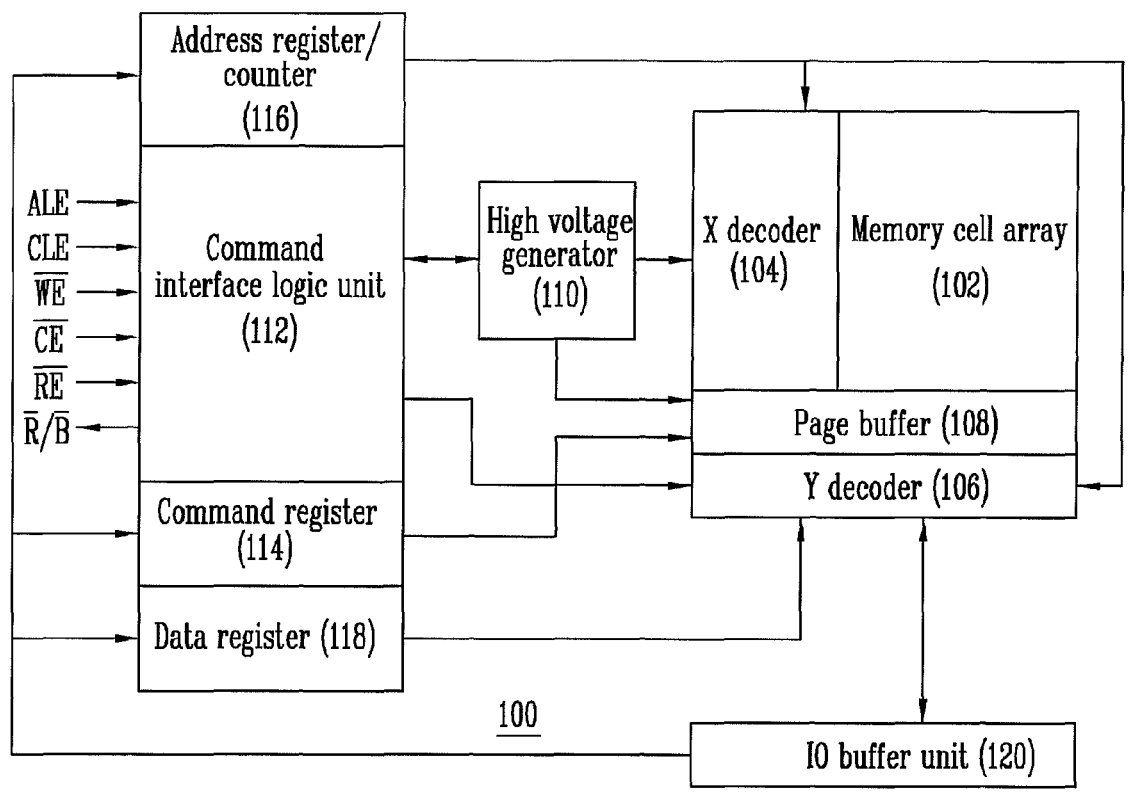
FIG. 1 is a diagram showing the overall construction of a nonvolatile memory device according to an embodiment.

FIG. 1 is a diagram showing the entire construction of a nonvolatile memory device according to an exemplary embodiment.

The nonvolatile memory device 100 includes a memory cell array 102, a page buffer 108, X and Y decoders 104 and 106, a high voltage generator 110, a command interface logic unit 112, a command register 114, an address register/counter 116, a data register 118, and an IO buffer unit 120. The operation of the nonvolatile memory device is described below.

First, when a chip enable signal /CE for the command interface logic unit 112 is disabled and a write enable signal /WE is toggled on, the command interface logic unit 112 receives a command signal through the IO buffer unit 120 and the command register 114 subsequently and generates a program command, an erase command, a read command, etc. according to the command. Here, the command signal includes a page program setup code for determining the operation mode of the nonvolatile memory device.

Meanwhile, an operation state signal /R/B output from the command interface logic unit 112 is disabled for a certain period of time. An external memory controller (not shown) receives the operation state signal /R/B, and the nonvolatile memory device detects an operation state, such as a program, erase, or read operation. That is, while the operation state signal /R/B is disabled, a program, erase, or read operation for one page of a memory cell array is performed.

The address register/counter 116 receives an address signal via the IO buffer unit 120 and generates a row address signal and a column address signal. The address signal corresponds to one of a plurality of pages, where each page includes a plurality of memory cells. The data register 118 temporarily stores various data received via the IO buffer unit 120 and transfers the data to the Y decoder 106.

The high voltage generator 110 generates bias voltages in response to a program command, an erase command or a read command and supplies the bias voltages to the page buffer 108, the X decoder 104, etc.

The X decoder 104 supplies the bias voltages, received from the high voltage generator 110, to the memory cell array 102 (i.e., one of memory cell arrays) in response to the row address signal. The Y decoder 106 supplies a data signal to bit lines (not shown), shared by the blocks of the memory cell array, through the page buffer in response to the column address signal.

The page buffer 108 latches the data signal received via the IO buffer unit 120 and the Y decoder 106 and outputs the data signal to the bit lines (not shown) shared by the blocks of the memory cell array.

Figure 2:
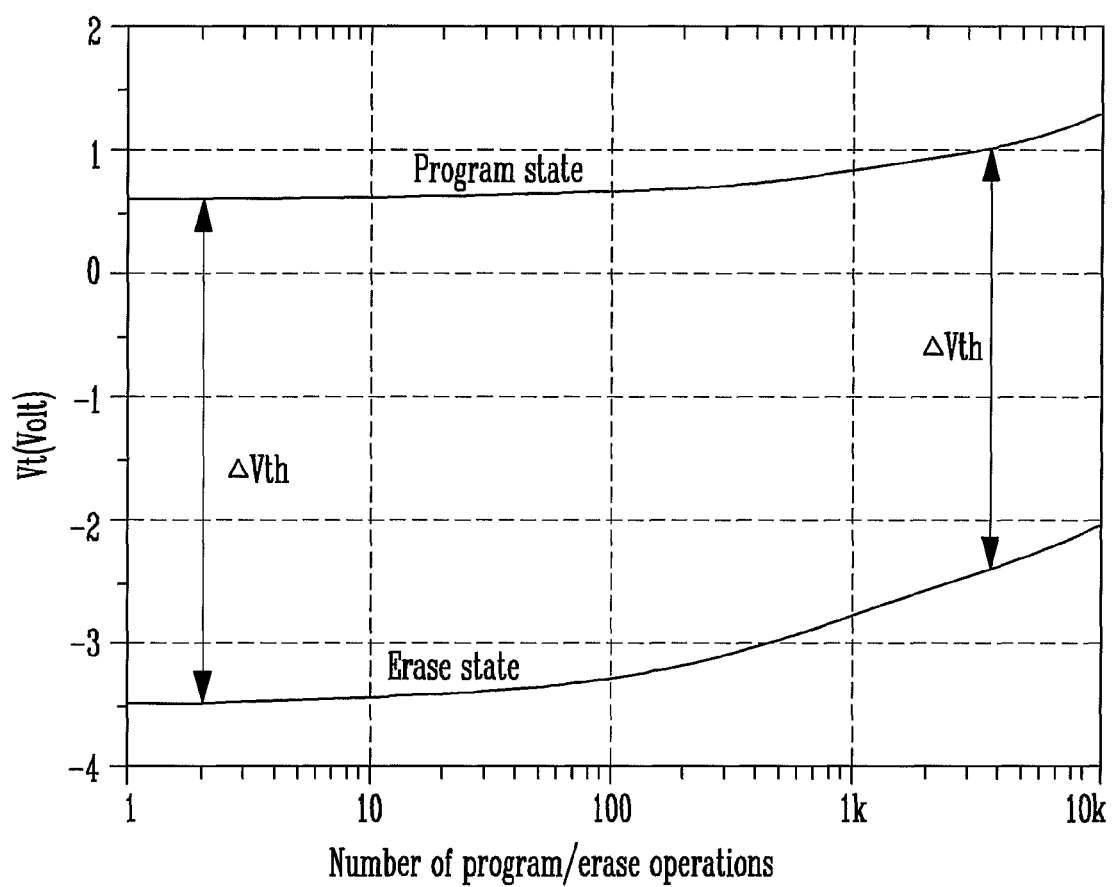
FIG. 2 is a graph showing a change in the threshold voltage depending on the increase in the number of program/erase cycles performed in a known nonvolatile memory device.

FIG. 2 is a graph showing a change in the threshold voltage depending on the increase in the number of program/erase cycles in a known nonvolatile memory device.

As shown in FIG. 2, with the increasing number of program/erase cycles, the threshold voltage of a program state and the threshold voltage of an erase state increase. This is because, as the number of program/erase cycles performed on a memory cell increases, electric charges trapped at the floating gate of the nonvolatile memory cell increases and therefore the threshold voltage also increases even for the erase state. As a result, a change in the threshold voltage as the number of program/erase cycles performed on a memory cell increases further increases although the same program pulse is applied. A change in the threshold voltage is related to a program speed. That is, if a change in the threshold voltage is large when the same program pulse is applied, it is considered that the program speed is fast.

From FIG. 2, it can be seen that the threshold voltage of the program state when the number of program/erase cycles performed on a memory cell is 10K is higher than the threshold voltage of the program state when the number of program/erase cycles is 10. This is the same even in the erase state. A program method of compensating for a change in the program speed depending on the number of program/erase cycles is used.

Figure 3:
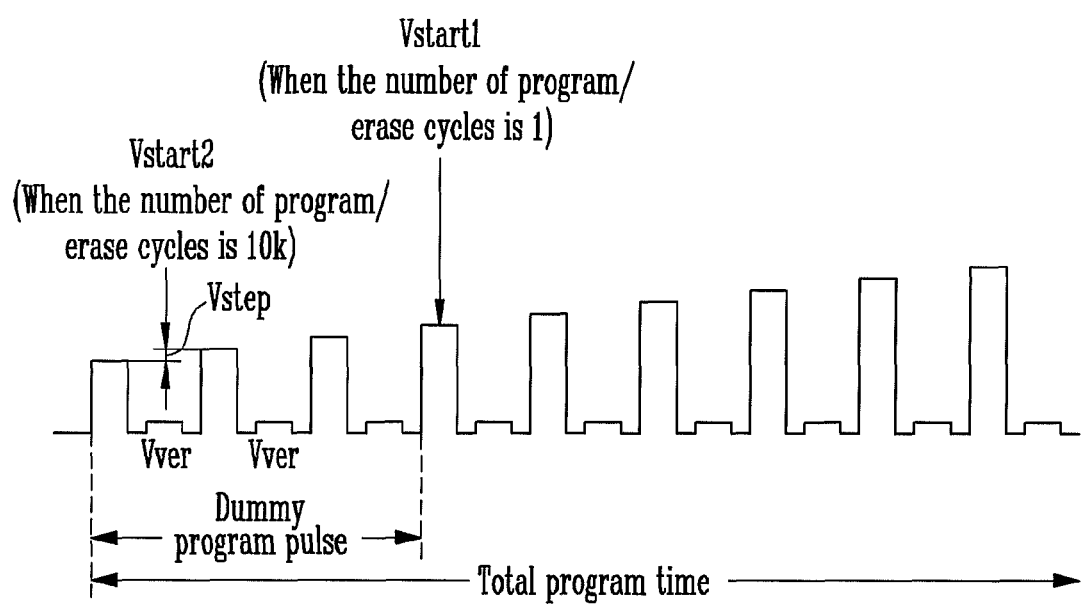
FIG. 3 is a diagram showing the concept of a known method of programming a nonvolatile memory device.

FIG. 3 is a diagram showing the concept of a known method of programming a nonvolatile memory device.

As shown in FIG. 3, a program operation is performed using an ISPP method. In more detail, after a program pulse is applied, a verification operation is performed. Whenever the verification operation is repeatedly performed, a program operation is repeatedly performed by increasing a program voltage by a step voltage (Vstep). Here, a period where dummy program pulses are applied is added by taking into consideration that the program speed is changed depending on the number of program/erase cycles.

When the number of program/erase cycles is 1, an ISPP operation is performed on the basis of a first start voltage Vstart1. However, when the number of program/erase cycles is 10K, the ISPP operation needs to be performed on the basis of a second start voltage Vstart2 lower than the first start voltage Vstart1 because the program speed is fast. Accordingly, the ISPP operation is performed with the second start voltage Vstart2 even when the program/erase operations is first performed. When the number of program/erase cycles is a number between 1 k to 10K, the program effect may not substantially occur because the program start voltage is low. Accordingly, when the number of program/erase cycles is a number between 1 to 10K, program pulses applied from when the second start voltage Vstart2 is applied until the first start voltage Vstart1 is applied may become dummy program pulses. In preparation for a case where the number of program/erase cycles becomes 10K or more, the dummy program pulses are applied. In this case, however, the program time is prolonged until the number of program/erase cycles becomes 10K.

Figure 4:
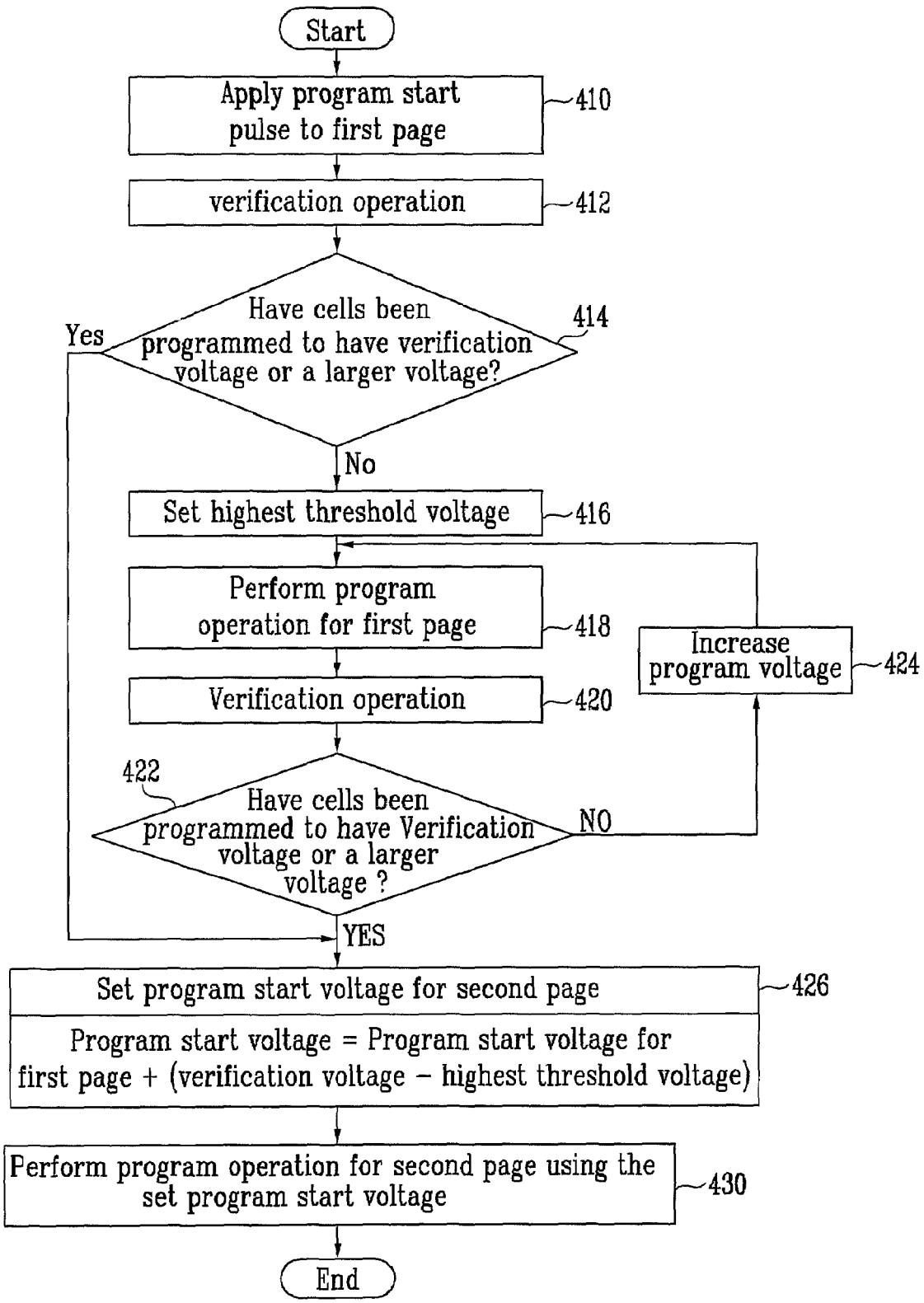
FIG. 4 is a flowchart showing an exemplary method of programming a nonvolatile memory device according to an embodiment.

FIG. 4 is a flowchart showing a method of programming a nonvolatile memory device according to an embodiment, and FIG. 5 is a diagram showing the concept of a method of setting the highest threshold voltage in the method of programming a nonvolatile memory device according to an embodiment.

First, a program operation is performed on a first page by applying a program start pulse to the first page at step 410.

According to an embodiment, the program operation is performed based on an ISPP start voltage. It is intended to control the value of the program start pulse for a second page based on the state of the program operation for the first page.

A verification operation is then performed on the program operation at step 412.

The verification operation is performed in order to verify whether all the cells to be programmed have been programmed to have a verification voltage or a larger voltage at step 414. The verification operation is performed using the verification operation of a known nonvolatile memory device, and a detailed description thereof is omitted.

As a result of the verification operation, all the cells to be programmed have been programmed to have the verification voltage or a larger voltage, and a program operation for a next page (i.e., a second page) is performed.

However, if, as a result of the verification operation, all the cells to be programmed have not been programmed to have the verification voltage or a larger voltage, the highest threshold voltage is set at step 416.

A method of setting the highest threshold voltage is described below with reference to FIG. 5. At the early stage in which the number of program/erase cycles is relatively small, the program speed is not relatively fast. Accordingly, there may be no cells which have been programmed to have a verification voltage or a larger voltage with only the application of one program pulse. In other words, as a result of a verification operation performed based on a verification voltage (Vver), if there are no cells programmed to have the verification voltage (Vver) or a larger voltage, the verification voltage (Vver) is decreased and the verification operation is repeatedly performed. If, as described above, the verification operation is repeatedly performed based on the repeatedly decreased verification voltage (Vver), a cell programmed to have the decreased and reset verification voltage (Va) or a larger voltage may be detected, and the threshold voltage of the cell may be used to set the highest threshold voltage.

Meanwhile, when the number of program/erase cycles performed is relatively large, the program speed is fast. Accordingly, there may be cells programmed to have a verification voltage or a larger voltage with only the application of one program pulse. In other words, as a result of a verification operation performed based on a verification voltage (Vver), if there are cells programmed to have the verification voltage (Vver) or a larger voltage, the verification voltage (Vver) is increased and the verification operation is repeatedly performed. If, as described above, the verification operation is performed again based on the increased verification voltage (Vver), even a cell having a threshold voltage higher than the increased and reset verification voltage (Vb) can be detected, and the verification voltage applied in this case can be used to set the highest threshold voltage. Alternatively, there may not be cells having a threshold voltage higher than the increased and reset verification voltage (Vb), and a verification voltage which had been applied before the application of the verification voltage (Vb) can be used to set the highest threshold voltages.

Referring back to FIG. 4, after the step 416, the program operation for the first page is performed at step 418.

Since the program would not be completed with only the program start pulse, the program voltage is increased by a step voltage (Vstep) and the program operation is repeatedly performed.

Next, a verification operation for the program operation is performed at step 420.

Like in the verification operation at step 412, it is verified whether all the cells to be programmed have been programmed to have the verification voltage or a larger voltage.

If, as a result of the verification operation, all cells to be programmed have not been programmed to have the verification voltage or a larger voltage, the program voltage is increased by a step voltage at step 424 and the program operation is repeatedly performed.

However, if, as a result of the verification operation, all the cells to be programmed have been programmed to have the verification voltage or a larger voltage, a program start voltage for a second page is set before a program operation for the second page is performed at step 426.

Here, a relationship between the first page and the second page is described. The first page and the second page are included in a common memory cell block (i.e., the unit of an erase operation) and may have the same number of performed erase operations. Further, each of the first and second pages may become the unit of a program operation depending on whether the memory device is a NAND type nonvolatile memory device. Accordingly, it can be seen that the first page and the second page have substantially the same number of program/erase cycles and have approximately the same characteristics depending on the number of program/erase cycles. Accordingly, the program start pulse of the second page is set based on the characteristic of the first page, set at step 416.

The program start voltage for the second page is obtained by adding a difference between the verification voltage and the highest threshold voltage to the program start voltage for the first page.

That is, the program start voltage for the second page can be expressed by the following equation.

The program start voltage for the second page=the program start voltage for the first page+(the verification voltage−the highest threshold voltage)

In the case where, as shown in (a) of FIG. 5, the highest threshold voltage is lower than a verification voltage because the number of program/erase cycles is relatively small, a program start voltage for a second page is higher than a program start voltage for a first page. Accordingly, at the early stage where the number of program/erase cycles is relatively small, an ISPP operation is performed based on a program start voltage higher than a dummy program pulse.

In the case where, as shown in (b) of FIG. 5, the highest threshold voltage is higher than a verification voltage because the number of program/erase cycles is relatively large, a program start voltage for a second page is lower than a program start voltage for a first page. Accordingly, when the number of program/erase cycles increases, an ISPP operation is performed based on a program start voltage lower than a dummy program pulse.

Next, the program operation for the second page is performed based on the set program start voltage at step 430.

In the program operation for the second page, the program start voltage for each of a first page and the second page is set by performing the above-described steps. A program operation for each of the pages included in the same memory cell block is completed by repeatedly performing the above described operation.

A program start voltage can be variably set according to the above-described operation. In particular, at the early stage where the number of program/erase cycles is relatively small, a program start voltage is set to be relatively high, so the characteristic of a cell having a slow program speed can be compensated. At the latter operation where the number of program/erase cycles is relatively large, a program start voltage is set to be relatively low, so the characteristic of a cell having a fast program speed can be compensated.

What is claimed is:

1. A method of programming a nonvolatile memory device, comprising:
    performing a program operation on a first page by applying a program pulse to the first page;
    performing a verification operation on the program operation by applying a verification voltage to the first page;
    if, as a result of the verification operation, the program operation for the first page has not been completed, setting a voltage, selected from threshold voltages of the first page, as a highest threshold voltage;
    completing the program operation for the first page by repeatedly performing the program operation and the verification operation on the first page while a voltage level of the program pulse is increased;
    setting a sum of a program start voltage for the first page and a difference between the verification voltage and the highest threshold voltage as a program start voltage for a second page; and
    performing a program operation for the second page based on the set program start voltage for the second page.

2. The method of claim 1, wherein the setting of the highest threshold voltage comprises:
    if none of memory cells on which the program operation has been performed has been programmed to have the verification voltage or a larger voltage, decreasing the verification voltage and performing a verification operation based on the decreased verification voltage;
    repeatedly decreasing the verification voltage until a cell programmed to have the decreased verification voltage or a larger voltage is detected by repeatedly performing the verification operation based on the decreased verification voltage; and if a cell programmed to have the decreased verification voltage or a larger voltage is detected, setting a verification voltage applied at the corresponding point of time as the highest threshold voltage.

3. The method of claim 1, wherein the setting of the highest threshold voltage comprises:
   if any one of memory cells on which the program operation has been performed has been programmed to have the verification voltage or a larger voltage, increasing the verification voltage and performing a verification operation based on the increased verification voltage;
   repeatedly increasing the verification voltage until a cell programmed to have the increased verification voltage or a larger voltage is not detected and repeatedly performing the verification operation based on the increased verification voltage; and
   if a cell programmed to have the increased verification voltage or a larger voltage is not detected, setting a verification voltage applied before the verification voltage at the corresponding point of time as the highest threshold voltage.

4. The method of claim 1, wherein the setting of the program start voltage for the second page comprises:
   when the verification voltage is higher than the highest threshold voltage, setting the program start voltage for the second page so that the program start voltage for the second page is higher than the program start voltage for the first page; and
   when the verification voltage is lower than the highest threshold voltage, setting the program start voltage for the second page so that the program start voltage for the second page is lower than the program start voltage for the first page.

5. A method of programming a nonvolatile memory device by applying dummy program pulses in order to compensate for an increased program speed caused by an increased number of program/erase cycles, the method comprising:
   performing a program operation on a first page by applying a program pulse to the first page;
   performing a verification operation on the program operation by applying a verification voltage to the first page;
   if, as a result of the verification operation, the program operation for the first page has not been completed, setting a voltage, selected from threshold voltages of the first page, as a highest threshold voltage;
   completing the program operation for the first page by repeatedly performingthe program operation and the verification operation on the first page while a voltage level of the program pulse is increased;
   setting a sum of a program start voltage for the first page and a difference between the verification voltage and the highest threshold voltage as a program start voltage for a second page; and
   performing a program operation for the second page based on the set program start voltage for the second page.

6. The method of claim 5, wherein the setting of the highest threshold voltage comprises:
   if none of memory cells on which the program operation has been performed has been programmed to have the verification voltage or a larger voltage, repeatedly decreasing the verification voltage until a cell programmed to have the verification voltage or a larger voltage is detected by repeatedly performing a verification operation based on the decreased verification voltage; and
   if a cell programmed to have the decreased verification voltage or a larger voltage is detected, setting a verification voltage applied at the corresponding point of time as the highest threshold voltage.

7. The method of claim 5, wherein the setting of the highest threshold voltage comprises:
   if any one of memory cells on which the program operation has been performed has been programmed to have the verification voltage or a larger voltage, repeatedly increasing the verification voltage until a cell programmed to have the verification voltage or a larger voltage is not detected by repeatedly performing a verification operation based on the increased verification voltage; and
   if a cell programmed to have the increased verification voltage or a larger voltage is not detected, setting a verification voltage applied before a verification voltage at the corresponding point of time as the highest threshold voltage.

8. The method of claim 5, wherein the setting of the program start voltage for the second page comprises:
   when the verification voltage is higher than the highest threshold voltage, setting the program start voltage for the second page so that the program start voltage for the second page is higher than the program start voltage for the first page; and
   when the verification voltage is lower than the highest threshold voltage, setting the program start voltage for the second page so that the program start voltage for the second page is lower than the program start voltage for the first page.

* * * * *